United States Patent
Sato et al.

(10) Patent No.: US 11,867,295 B2
(45) Date of Patent: Jan. 9, 2024

(54) SLIDING MEMBER

(71) Applicant: TPR Co., Ltd., Tokyo (JP)

(72) Inventors: Tomoyuki Sato, Tokyo (JP); Yutaka Kitazume, Tokyo (JP); Kiyoyuki Kawai, Tokyo (JP); Haojie Fu, Tokyo (JP)

(73) Assignee: TPR Co., Ltd., Tokyo (JP)

( * ) Notice: Subject to any disclaimer, the term of this patent is extended or adjusted under 35 U.S.C. 154(b) by 0 days.

(21) Appl. No.: 18/027,777

(22) PCT Filed: Sep. 30, 2021

(86) PCT No.: PCT/JP2021/036227
§ 371 (c)(1),
(2) Date: Mar. 22, 2023

(87) PCT Pub. No.: WO2023/053380
PCT Pub. Date: Apr. 6, 2023

(65) Prior Publication Data
US 2023/0392688 A1  Dec. 7, 2023

(51) Int. Cl.
*F16J 9/26* (2006.01)
(52) U.S. Cl.
CPC ...................... *F16J 9/26* (2013.01)
(58) Field of Classification Search
CPC ........................................................ F16J 9/26
See application file for complete search history.

(56) References Cited

U.S. PATENT DOCUMENTS

| | | | |
|---|---|---|---|
| 11,168,790 B2 * | 11/2021 | Kameda | ................ F16N 15/02 |
| 2011/0178728 A1 | 7/2011 | Sawa | |
| 2015/0136062 A1 | 5/2015 | Tsuji et al. | |
| 2015/0300493 A1 | 10/2015 | Kunimoto et al. | |
| 2016/0003356 A1 | 1/2016 | Ozaki et al. | |
| 2020/0284346 A1 | 9/2020 | Kameda et al. | |
| 2021/0270370 A1 | 9/2021 | Sato et al. | |

FOREIGN PATENT DOCUMENTS

| | | |
|---|---|---|
| JP | 2005-326378 A | 11/2005 |
| JP | 2011-145190 A | 7/2011 |
| JP | 2014-129826 A | 7/2014 |
| JP | 2017-013136 A | 1/2017 |

(Continued)

OTHER PUBLICATIONS

"Intensity Evaluation of DLC Film," TOYO Corporation (Aug. 2016).

(Continued)

*Primary Examiner* — Gilbert Y Lee
(74) *Attorney, Agent, or Firm* — MARSHALL, GERSTEIN & BORUN LLP

(57) ABSTRACT

An object of the present invention is to provide a sliding member coated with a DLC coating in which microfractures on the sliding surface thereof due to the progression of cracks are less likely to occur, and in which an increase in abrasive wear can be reduced. The present invention achieves the above-mentioned object by a sliding member having, on the outer peripheral sliding surface thereof, a DLC coating in which the amount of plastic deformation work as measured by a nanoindentation test is within a specific range.

5 Claims, 5 Drawing Sheets

(56) References Cited

FOREIGN PATENT DOCUMENTS

| JP | 2019-077904 A | 5/2019 |
| JP | 2020-003022 A | 1/2020 |
| JP | 2020-200803 A | 12/2020 |
| JP | 2021-095957 A | 6/2021 |
| WO | WO-2013/137060 | 9/2013 |
| WO | WO-2014/133095 A1 | 9/2014 |

OTHER PUBLICATIONS

"Introduction of Thin Film Hardness Tester (Nanoindentors) and Measurement Examples", Industrial Research Institute of Niigata Prefecture, http://www.iri.pref.niigata.jp/pdf/news/25new97_r3, Dec. 17, 2013, 8 pages.
Basic Principle of Nanoindentors; https://www.toyo.co.jp/microscopy/casestudy/detail/NI_principle, Toyo Corporation, published on Aug. 17, 2016, 9 pages.
Claver et al., "Comparative Study of Tribomechanical Properties of HiPIMS With Positive Pulses DLC Coatings on Different Tools Steels", Coatings, vol. 11(1), 28, 21 pages; https://doi.org/10.3390/coatings11010028, published on Dec. 29, 2020.
Decision of Refusal for Japanese Application No. 2021-559356, dated Feb. 1, 2022.
Decision of Refusal in JP Application No. 2021-559356 dated Feb. 8, 2022, 8 pages.
Decision to Grant for Japanese Application No. 2021-559356, dated Apr. 12, 2022.
Intensity Evaluation of DLC Film, Internet, Toyo Corporation: https://web.archive.org/web/20160823182945/http://www.toyo.co.jp:80/microscopy/application/?id=11478 Aug. 2016, 3 pages.
Metallic Materials—Instrumented Indentation Test for Hardness and Materials Parameters, ISO 14577-1:2015(E), Second Edition, Jul. 15, 2015, 28 pages.
Office Action in JP Application No. 2021-559356 dated Dec. 7, 2021, 6 pages.
Opposition filed in JP Application No. 2021-559356 dated Jan. 13, 2023, 47 pages.
Search Report in International Application No. PCT/JP2021/036227 dated Dec. 7, 2021, 2 pages.
Office Action in JP Application No. 2022-039171 dated Jun. 27, 2023, 10 pages.

\* cited by examiner

SLIDING MEMBER

TECHNICAL FIELD

The present invention relates to a sliding member mainly used in an internal combustion engine.

BACKGROUND ART

DLC (diamond-like carbon) coatings are coatings having an amorphous structure (non-crystalline structure) in which $sp^2$ bonding of carbon atoms corresponding to the graphite structure, and $sp^3$ bonding of carbon atoms corresponding to the diamond structure coexist. DLC coatings having various properties can be formed by adjusting the ratio of both binding components.

DLC coatings having excellent wear resistance and sliding properties have been used for sliding members in internal combustion engines which are used in harsh sliding environments. Examples of the sliding member to be used in an internal combustion engine include piston rings, cylinder liners and camshafts.

Patent Document 1 discloses that the amount of wear of a DLC coating can be reduced, when the ratio Wp/We of the elastic deformation energy We to the plastic deformation energy Wp, in the DLC coating, is 0.60 or more.

Patent Document 2 discloses that, in the combination of an aluminum alloy cylinder of an internal combustion engine and a piston ring that slides against the inner peripheral surface of the cylinder, the smooth shape of the inner peripheral surface of the cylinder and the wear resistance can be maintained for a long period of time, when the ratio Wp/We of the elastic deformation energy We to the plastic deformation energy Wp, in a DLC coating coated on the outer peripheral surface of the piston ring and consisting solely of hydrogen and carbon, or composed of hydrogen, carbon and nitrogen, is 0.45 or less.

RELATED ART DOCUMENTS

Patent Documents

Patent Document 1: JP 2021-95957 A
Patent Document 2: WO 2013/137060

SUMMARY OF THE INVENTION

Problems to be Solved by the Invention

While various developments have been done on DLC coatings, the present inventors have arrived at the fact that carbon sludge and the like derived from lubricating oil and fuel components are formed due to the complicated operational environment of an internal combustion engine, and the presence of such carbon sludge and the like may lead to an insufficient wear resistance of the DLC coating of a DLC-coated sliding member to cause the occurrence of abrasion.

That is, there is a problem that a sliding member having a conventionally-disclosed DLC coating does not have a sufficient wear resistance (abrasive wear resistance) when a foreign substance such as carbon sludge is mixed.

The present inventors presume that, when such a sliding member is slid in a state where a foreign substance such as carbon sludge is present, minute cracks may occur on the sliding surface of the DLC coating, and the progression of such cracks causes the occurrence of microfractures on the sliding surface, resulting in an increased wear.

The present invention has been made in view of the problem described above, and an object of the present invention is to provide a sliding member which has a good wear resistance (abrasive wear resistance) even in an environment where a foreign substance such as carbon sludge is present.

Means for Solving the Problems

As a result of intensive studies to solve the problem described above, the present inventors have found out that the above-described problem can be solved by a sliding member having, on the outer peripheral sliding surface thereof, a DLC coating in which the amount of plastic deformation work as measured by a nanoindentation test is within a specific range, thereby completing the present invention. Specifically, the present inventors have found out that it is possible to improve the toughness of the DLC coating and to improve the wear resistance of the DLC coating, by increasing the amount of plastic deformation work as measured by a nanoindentation test.

The present invention provides a sliding member having a DLC coating on the outer peripheral sliding surface thereof, wherein, in the DLC coating, the amount of plastic deformation work ($W_{plast}$) as measured by a nanoindentation test at a load of 100 mN is 5.7 nJ or more.

Further, in the DLC coating, the amount of total work ($W_{total}$) is preferably 18.1 nJ or more, the rate of plastic deformation work ($\eta_{plast}$) is preferably 31.3% or more, and the ratio (HIT/$W_{plast}$) of nanoindentation hardness (HIT) to the amount of plastic deformation work ($W_{plast}$) is preferably 5.3 GPa/nJ or less.

Moreover, the DLC coating preferably does not substantially contain hydrogen, preferably has a hydrogen content of 0.5 at % or less, and the sliding member is preferably a piston ring.

Effect of the Invention

The present invention enables to provide a sliding member coated with a DLC coating in which microfractures on the sliding surface thereof due to the progression of cracks are less likely to occur, and in which an increase in abrasive wear can be reduced.

MODE FOR CARRYING OUT THE INVENTION

Figure 1:
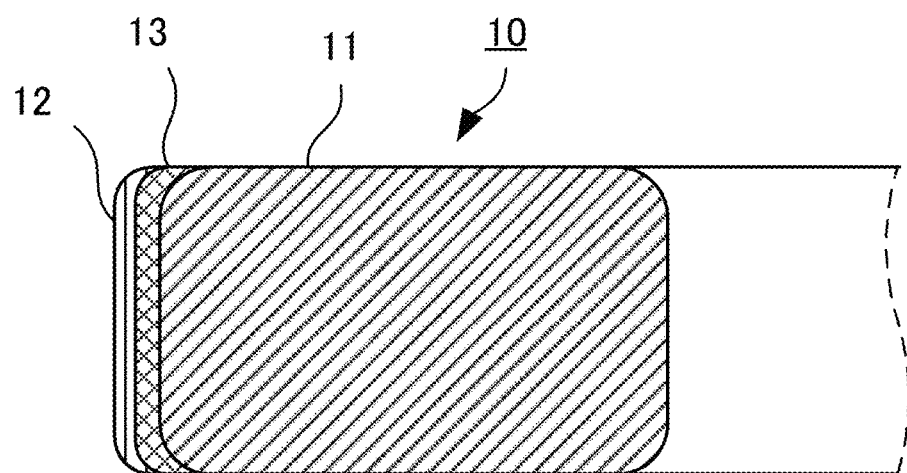
FIG. 1 is a cross-sectional schematic diagram showing a piston ring in which a DLC coating having an underlayer is formed on a piston ring substrate.

While specific embodiments will be described below, each embodiment is shown as one example of the present invention and does not necessary specify the invention according to any one of claims. Further, not all of the characteristics described in the embodiments are essential for the means for achieving the object of the present invention.

An embodiment according to the present invention is a sliding member having a DLC coating on the outer peripheral sliding surface thereof. The sliding member may be one used in an internal combustion engine, or may be one used for those other than internal combustion engines, but can be used particularly suitably as a sliding member used in an internal combustion engine.

Examples of the sliding member to be used in an internal combustion engine include piston rings, cylinder liners and camshafts. Hereinafter, a piston ring as a typical example of the sliding member will be described.

In the DLC coating included in the sliding member, the amount of plastic deformation work ($W_{plast}$) as measured by a nanoindentation test at a load of 100 mN is 5.7 nJ or more.

The term "amount of plastic deformation work (plastic deformation energy) ($W_{plast}$)" refers, of the amount of work spent for an indenter to be pressed into the coating surface in the nanoindentation test, to the amount of work spent for the plastic deformation that allows the coating to remain deformed even when the indenter is unloaded. Further, the term "amount of elastic deformation work (elastic deformation energy) ($W_{elast}$)" refers to the amount of work released by the restoration of the coating to its original state when the indenter is unloaded. The "rate of plastic deformation work ($\eta_{plast}$) serves as an index that characterizes whether or not the coating is susceptible to plastic deformation when a foreign substance is pressed into the coating surface. The present inventors have found out that, when the amount of plastic deformation work ($W_{plast}$) as measured by a nanoindentation test at a load of 100 mN is 5.7 nJ or more, microfractures on the sliding surface due to the progression of cracks are less likely to occur in the DLC coating, and an increase in the abrasive wear thereof can be reduced.

Further, the amount of plastic deformation work ($W_{plast}$) as measured by the nanoindentation test is preferably 6.2 nJ or more. The upper limit value of the amount of plastic deformation work is not particularly limited, but is preferably 8.0 nJ or less.

The nanoindentation test was carried out using a nanoindentation measuring device, Model HM-2000, manufactured by Fischer Instruments K. K. and using a Vickers indenter, under the conditions of an indentation load of 100 mN, a loading time until the maximum indentation load of 30 s (seconds), a retention time of 5 s (seconds) and an unloading time of 30 s (seconds). The amount of plastic deformation work, the amount of elastic deformation work, the nanoindentation hardness, and the Young's modulus to be described later, of the DLC coating, are calculated using the load-indentation depth curve obtained in the nanoindentation test. The measurement was carried out at a total of three locations in the circumferential direction of one piston ring, namely, at a position opposite from the abutment of the piston ring and positions 90° on both sides from the abutment. Four points at each of the three locations, 12 points in total, were measured, and the mean value of these measurements was taken as the measured value.

The amount of total work total ($W_{total}$; also referred to as the amount of total deformation work) as measured by the nanoindentation test and calculated by the following Formula (1) is preferably 18.1 nJ or more. The upper limit value of the amount of total work is not particularly limited, but is preferably 23.0 nJ or less.

When the above-described range is satisfied, microfractures on the sliding surface due to the progression of cracks are less likely to occur in the DLC coating, and an increase in the abrasive wear thereof can be reduced, which are preferred.

$$W_{total}=W_{plast}+W_{elast} \quad (1)$$

Further, the rate of plastic deformation work ($\eta_{plast}$) as measured by the nanoindentation test and calculated by the following Formula (2) is preferably 31.3% or more. The rate of plastic deformation work is more preferably 32.4% or more, and still more preferably 33.0% or more. The upper limit value of the rate of plastic deformation work is not particularly limited, but is preferably 38.0% or less.

When the above-described range is satisfied, microfractures on the sliding surface due to the progression of cracks are less likely to occur in the DLC coating, and an increase in the abrasive wear thereof can be reduced, which are preferred.

$$\eta_{plast}=(W_{plast}/W_{total})\times 100(\%) \quad (2)$$

In addition, the ratio (HIT/$W_{plast}$) of the nanoindentation hardness (HIT) to the amount of plastic deformation work ($W_{plast}$), as measured by the nanoindentation test, is preferably 5.3 GPa/nJ or less, and more preferably 4.1 GPa/nJ or less. The lower limit value of the ratio (HIT/$W_{plast}$) of the nanoindentation hardness (HIT) to the amount of plastic deformation work ($W_{plast}$) is not particularly limited, but is preferably 2.0 GPa/nJ or more.

When the above-described range is satisfied, microfractures on the sliding surface due to the progression of cracks are less likely to occur in the DLC coating, and an increase in the abrasive wear thereof can be reduced, which are preferred.

The above-described amount of plastic deformation work as measured by the nanoindentation test can be adjusted to a desired value by adjusting the production method of the DLC coating. More specifically, in cases where the DLC coating is formed using the filtered cathodic vacuum arc (FCVA) technique, the pulse bias voltage to be applied may be adjusted, for example, within the range of from −500 V to −2500 V, and preferably from −700 V to −2500 V. In addition, the amount of plastic deformation work can be adjusted to a desired value by adjusting the substrate temperature, chamber pressure (degree of vacuum), arc current, purity of target and the like when forming the DLC coating.

Specific embodiments of the present invention will be described below, with reference to the case where the sliding member is a piston ring, as an example.

The piston ring 10 shown in FIG. 1 is fitted in a piston ring groove (not shown) formed in a piston, and moves reciprocatingly due to the reciprocating motion of the piston while sliding on the inner peripheral surface of a cylinder bore (not shown).

The piston ring 10 may be used as any of the piston rings, namely, a top ring, a second ring and an oil ring. In the case of being used as an oil ring, the piston ring 10 may be used either as an oil ring body of an oil ring having a two-piece configuration composed of the oil ring body and a coil expander, or as a segment of an oil ring having a three-piece configuration composed of two segments (also referred to as side rails) and an expander-spacer. In one embodiment, the piston ring is attached to a piston made of an aluminum alloy, and used as a piston ring against a cylinder bore made of cast iron. However, the materials of the piston and the cylinder are not limited thereto.

The material of a piston ring substrate 11 is not particularly limited, as long as it is a material conventionally used as a piston ring substrate. For example, a stainless steel material, a spring steel material or the like can be suitably used. Specifically, a martensite-based stainless steel, a silicon-chromium steel or the like can be suitably used.

The piston ring 10 shown in FIG. 1 includes: an underlayer 13 formed on the outer peripheral surface of the piston ring substrate 11 which has been subjected to smoothing, and containing Cr, Ti, Si or the like; and a DLC coating 12 formed on the underlayer 13. The adhesion between the DLC coating 12 and the piston ring substrate 11 can be improved by providing the underlayer 13 therebetween.

The underlayer 13 preferably has a film thickness of 0.2 μm or more and 2.0 μm or less. When the underlayer 13 has such a film thickness, the adhesion between the DLC coating 12 and the piston ring substrate 11 can further be improved. It is noted here that the DLC coating 12 may be formed directly on the outer peripheral surface of the piston ring substrate 11 which has been subjected to smoothing, without providing the underlayer 13.

The method of subjecting the outer peripheral surface of the piston ring substrate 11 to smoothing before the formation of the DLC coating 12 is not particularly limited, but it is preferred to perform grinding, buff polishing or the like, to adjust the surface roughness. In cases where the outer peripheral surface of the piston ring substrate 11 has a low surface roughness, the smoothing need not necessarily be performed.

The DLC coating 12 is preferably selected from a-C and ta-C having a hydrogen content of 0.5 at % or less (which is substantially hydrogen free).

The DLC coating 12 preferably has a film thickness of 1 μm or more, excluding that of the underlayer. The upper limit of the film thickness is not particularly limited, but is preferably 30 μm or less and more preferably 20 μm or less, since too large a film thickness may lead to risks of a decrease in the productivity and an increase in the cost.

Preferred physical properties as a coating of the DLC coating 12, in addition to satisfying the above-described parameters of the amount of plastic deformation work and the amount of elastic deformation work as measured by the nanoindentation test will be described below.

[Nanoindentation Hardness]

The DLC coating 12 may have a nanoindentation hardness of 15.0 GPa or more and 30.0 GPa or less, 28.0 GPa or less, or 26.0 GPa or less. In view of the wear resistance, a coating having a higher hardness is usually preferred. In the present embodiment, however, the DLC coating 12 preferably has a nanoindentation hardness within the above-described range, which is not excessively high. This is because, if the hardness of the coating is too high, the aggression to the cylinder bore sliding surface tends to increase, and in addition, the destruction of the coating occurs when the operation of assembling the piston ring into the piston, and the like, accompanies deformation, since the DLC coating is a coating formed on the outer peripheral surface of the piston ring.

[Young's Modulus]

The DLC coating 12 preferably has a Young's modulus of 335 GPa or less, and more preferably 310 GPa or less. If the DLC coating has a Young's modulus of more than 335 GPa, brittle fractures appear on the outermost surface layer of the DLC coating to result in an increased wear, when foreign substances such as deposits due to carbon sludge etc., or wear debris, dust and the like generated due to sliding, pass over the surface of the DLC coating. On the other hand, the lower limit of the Young's modulus is not particularly limited. However, the delamination within the film is less likely to occur when the DLC coating has a Young's modulus of 120 GPa or more.

The method of producing the DLC coating according to the present embodiment is not particularly limited. One example thereof may be, for example, a method of forming a coating using the filtered cathodic vacuum arc (FCVA) technique. In the case of using the FCVA technique, the DLC coating may be formed under a single condition, or alternatively, the DLC coating may be formed by performing the film formation multiple times while varying the pulse bias voltage to be applied, the substrate temperature, the chamber pressure (degree of vacuum), the arc current, the purity of target and the like, or without varying the pulse bias voltage. In the case of producing the DLC coating using the FCVA technique, the pulse bias voltage to be applied is set to a value higher than usual, for example, to a value of from −500 V to −2500 V, preferably from −700 V to −2500 V, and more preferably from −1000 V to −2500 V.

EXAMPLES

Next, the present invention will be described in further detail, with reference to Examples and Comparative Examples. However, the present invention is in no way limited to the following Examples.

EXAMPLES AND COMPARATIVE EXAMPLES

In each of the Examples and Comparative Examples, the pressure in an apparatus was reduced by evacuating the interior of the apparatus to vacuum, in a state where a piston ring substrate was set within the apparatus, and then the substrate was heated. Thereafter, each substrate was subjected to the FCVA technique, varying the substrate temperature, the pulse bias voltage, the chamber pressure (degree of vacuum), the arc current, the purity of target and the like, as appropriate, to obtain a piston ring having a DLC coating of each of Examples 1 to 7 and Comparative Examples 1 to 4, as shown in Table 1.

The DLC coating of each resulting piston ring was subjected to a nanoindentation test under the following conditions. The measurement was carried out at a total of three locations in the circumferential direction of one piston ring, namely, at a position opposite from the abutment of the piston ring and positions 90° on both sides from the abutment. Four points at each of the three locations, 12 points in total, were measured, and the mean value of these measurements was taken as the measured value.

Name of apparatus: nanoindentation measuring device, Model HM-2000, manufactured by Fischer Instruments K. K.

Indentation load: 100 mN
Loading time: 30 s (seconds)
Retention time: 5 s (seconds)
Unloading time: 30 s (seconds)

The resulting load-indentation depth curve was analyzed, and the analyzed results are summarized in Table 1.

TABLE 1

| | Wplast nJ | Wtotal nJ | ηplast % | HIT/Wplast GPa/nJ |
|---|---|---|---|---|
| Example 1 | 7.30 | 22.12 | 33.01 | 2.30 |
| Example 2 | 7.47 | 21.81 | 34.26 | 2.37 |

TABLE 1-continued

|  | Wplast nJ | Wtotal nJ | ηplast % | HIT/Wplast GPa/nJ |
|---|---|---|---|---|
| Example 3 | 7.47 | 21.15 | 35.30 | 2.53 |
| Example 4 | 7.11 | 20.50 | 34.70 | 3.01 |
| Example 5 | 6.75 | 18.18 | 37.10 | 4.11 |
| Example 6 | 6.23 | 19.23 | 32.40 | 4.07 |
| Example 7 | 5.70 | 18.16 | 31.38 | 5.25 |
| Comparative Example 1 | 5.46 | 17.27 | 31.64 | 6.11 |
| Comparative Example 2 | 5.24 | 16.54 | 30.99 | 6.78 |
| Comparative Example 3 | 5.11 | 15.90 | 30.88 | 7.30 |
| Comparative Example 4 | 4.78 | 16.29 | 29.33 | 8.11 |

$\eta_{plast}$: the rate of plastic deformation work (%)
$W_{total}$: the amount of total work (nJ)
$W_{plast}$: the amount of plastic deformation work (nJ)
HIT/$W_{plast}$: the ratio of nanoindentation hardness to the amount of plastic deformation work (GPa/nJ)

Subsequently, the DLC coating of each of Example 1, Examples 3 and 4, Examples 6 and 7 as well as Comparative Example 1 was evaluated. First, a test for measuring the amount of wear using a reciprocating friction and wear tester was carried out as follows.

Figure 2:
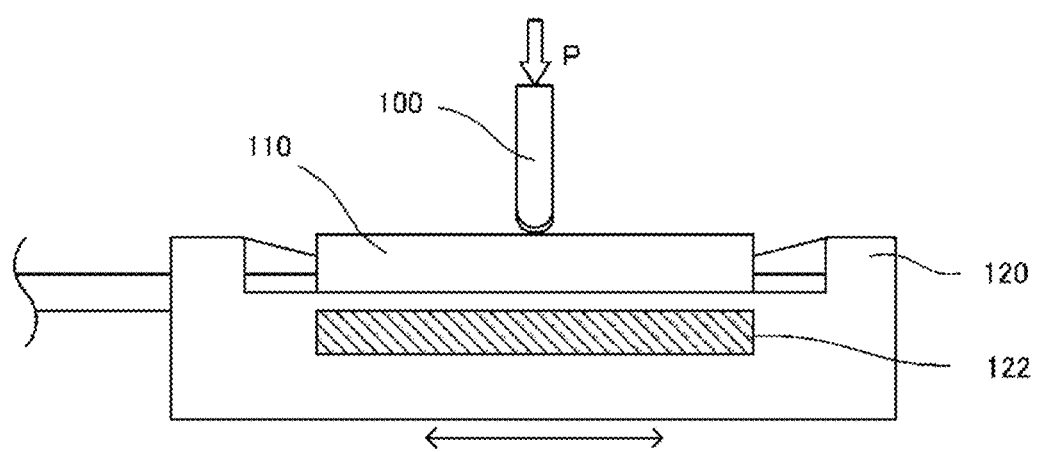
FIG. 2 is a schematic diagram showing the outline of a reciprocating friction and wear test.

FIG. 2 shows the outline of a pin-on-plate type reciprocating friction and wear test. First, a martensite-based stainless steel was formed into piston ring substrates each having a nominal diameter of 86 mm and a width in the sliding direction of 1.2 mm. On the outer peripheral surface of each resulting substrate, the DLC coating of each of the above-described Examples and Comparative Examples was formed, to prepare a piston ring whose outer peripheral sliding surface had been processed. A piston ring member having a circumference length of 20 mm was cut out from each of a total of three locations, namely, the position opposite from the abutment and the positions 90° on both sides from the abutment, of each resulting piston ring, and subjected to the test. The thus cut-out piston ring members were subjected to final finishing such that each piston ring member after the final finishing had a surface roughness, as a maximum height Rz, of 1.0 μm and the roughness curve of the surface thereof had a plateau shape. Each resulting piston ring member was used as an upper test piece 100.

As a lower test piece 110, a plate having a width of 17 mm, a length of 70 mm and a thickness of 14 mm, supposed to represent a cylinder bore made of flake graphite cast iron which is a JIS FC250-equivalent material and which has a hardness of HRB 100 and a carbide precipitation of 3%, was prepared. Thereafter, the final surface finishing was carried out using a #600 emery paper, and the resulting lower test piece 110 had a surface roughness, as a maximum height Rz, of 1.2 μm.

Conditions for the test for measuring the amount of wear are shown below. On the sliding surfaces of each upper test piece 100 and lower test piece 110, 150 μL of an engine lubricating oil 0W-20 which had been used in an actual engine operation so that carbon sludge and the like thereby generated were concentrated, was supplied in a test period of one hour.

<Test Conditions>
Stroke: 50 mm
Load: 50 N
Rate: 300 cycles/min
Temperature of lower test piece: 80° C. (a heater 122 for heating lower test piece, provided in a movable block 120 was used)
Test period: 60 min The measured results of the amount of wear (mean value, n=3) are shown in Table 2. The values of the amount of wear shown in Table 2 are relative values with respect to that in Comparative Example 1 taken as 1.

TABLE 2

|  | Amount of wear (relative value) |
|---|---|
| Example 1 | 0.05 |
| Example 3 | 0.11 |
| Example 4 | 0.15 |
| Example 6 | 0.32 |
| Example 7 | 0.67 |
| Comparative Example 1 | 1.00 |

Next, the DLC coating of each of Example 1, Examples 3 and 4, Examples 6 and 7 as well as Comparative Example 1 was formed on a plate made of SKD 11 material, and subjected to a Rockwell indentation test and a scratch test as follows. The results are shown in Table 3. By performing the Rockwell indentation test and the scratch test, and evaluating the status (length, number of occurrence and the like) of occurrence of cracks, it was possible to confirm the fact that the larger the number of cracks and the longer the length of cracks, the higher the amount of wear, as well.

Figure 3:
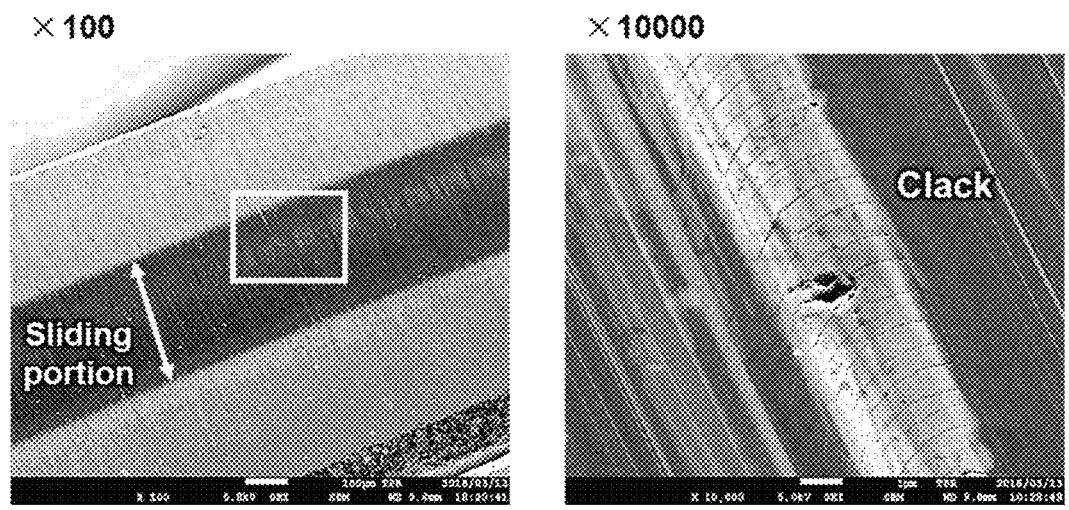
FIG. 3 shows enlarged views (drawing substitute photographs) of cracks occurred on the surface of the DLC coating.
Figure 4:
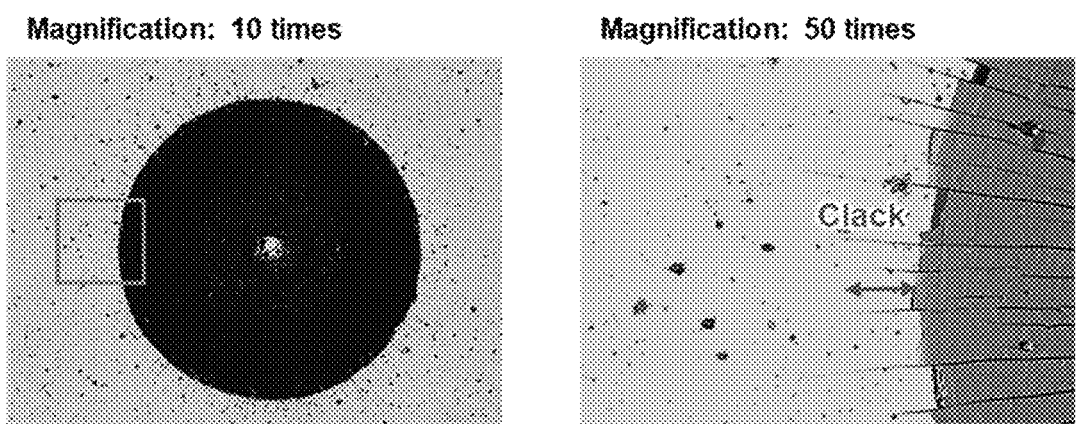
FIG. 4 shows laser microscopic images (drawing substitute photographs) illustrating the results of the Rockwell indentation test on the DLC coating of Example 1.
Figure 5:
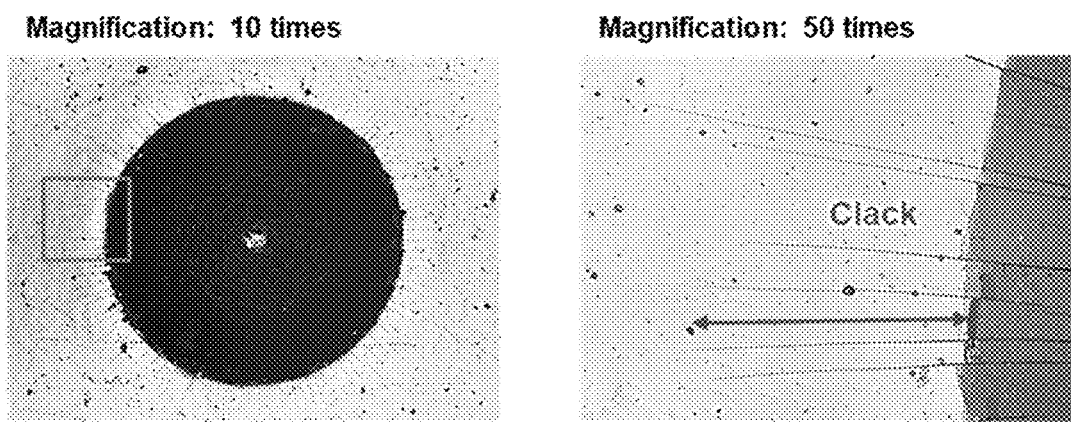
FIG. 5 shows laser microscopic images (drawing substitute photographs) illustrating the results of the Rockwell indentation test on the DLC coating of Comparative Example 1.

Further, FIG. 3 shows electron microscopic images showing the cracks formed on the surface of the DLC coating in an actual engine operation. FIG. 4 and FIG. 5 show laser microscopic images illustrating the results of the Rockwell indentation tests on the DLC coatings of Example 1 and Comparative Example 1, respectively.

<Rockwell Indentation Test>

In accordance with ISO 26443, a diamond indenter with a tip radius of 0.2 mm was pressed into each DLC coating with a load of 150 kgf, and the surface of the DLC coating was observed by a laser microscope. Four visual fields above, below, and the right and left sides of the indentation were enlarged (lens magnification: 50 times), and the mean value of the lengths of the three longest cracks (in the order from the longest crack) within each visual field was calculated. The measurement was carried out three times per sample, and the mean value thereof (n=12) was used for the evaluation. The results are shown in Table 3.

<Scratch Test>

Using a scratch tester manufactured by Anton Paar Ltd., each sample was moved 2 mm horizontally at a rate of 10 mm/min, while maintaining a load constant at 1 N. The results of the scratch test were observed by an electron microscope, and the occurrence of cracks was evaluated (n=3). Each sample was evaluated in accordance with the following criteria, and the evaluation results are shown in Table 3.

A: The occurrence of cracks was not observed on the surface of the DLC coating after the scratch test.

B: The occurrence of cracks was observed on the surface of the DLC coating after the scratch test, but the number of the cracks was relatively small.

C: The occurrence of a certain number of cracks was observed on the surface of the DLC coating after the scratch test.

D: The occurrence of a considerably large number of cracks was observed on the surface of the DLC coating after the scratch test.

TABLE 3

| | Crack length after Rockwell indentation test (μm) | Evaluation of crack occurrence after scratch test |
|---|---|---|
| Example 1 | 61.4 | A |
| Example 3 | 59.2 | B |
| Example 4 | 66.7 | B |
| Example 6 | 96.0 | C |
| Example 7 | 145.0 | C |
| Comparative Example 1 | 164.9 | D |

DESCRIPTION OF SYMBOLS

10 piston ring
11 piston ring substrate
12 DLC coating
13 underlayer
100 upper test piece
110 lower test piece
120 movable block
122 heater for heating lower test piece

The invention claimed is:

1. A sliding member comprising a DLC coating on an outer peripheral sliding surface thereof,
wherein the DLC coating has a hydrogen content of 0.5 at % or less; and
wherein, in the DLC coating, an amount of plastic deformation work ($W_{plast}$), as measured by a nanoindentation test at a load of 100 mN, is 5.7 nJ or more.

2. The sliding member according to claim 1, wherein, in the DLC coating, an amount of total work ($W_{total}$), as measured by the nanoindentation test and calculated by the following Formula (1), is 18.1 nJ or more:

$$W_{total}=W_{plast}+W_{elast} \tag{1}$$

3. The sliding member according to claim 1, wherein, in the DLC coating, a rate of plastic deformation work ($\eta_{plast}$), as measured by the nanoindentation test and calculated by the following formula (2), is 31.3% or more:

$$W_{plast}=(W_{plast}/W_{total})\times100(\%) \tag{2}$$

4. The sliding member according to claim 1, wherein, in the DLC coating, a ratio ($HIT/W_{plast}$) of nanoindentation hardness (HIT) to the amount of plastic deformation work ($W_{plast}$), as measured by the nanoindentation test, is 5.3 GPa/nJ or less.

5. The sliding member according to claim 1, wherein the sliding member is a piston ring.

* * * * *

UNITED STATES PATENT AND TRADEMARK OFFICE
CERTIFICATE OF CORRECTION

PATENT NO. : 11,867,295 B2  
APPLICATION NO. : 18/027777  
DATED : January 9, 2024  
INVENTOR(S) : Tomoyuki Sato et al.

Page 1 of 1

It is certified that error appears in the above-identified patent and that said Letters Patent is hereby corrected as shown below:

In the Claims

At Column 10, Line 18, "$W_{plast}=(W_{plast}/W_{total})\times 100(\%)$" should be -- $\eta_{plast}=(W_{plast}/W_{total})\times 100(\%)$ --.

Signed and Sealed this  
Eleventh Day of March, 2025

Coke Morgan Stewart  
*Acting Director of the United States Patent and Trademark Office*